United States Patent
Takemura

(10) Patent No.: US 8,575,678 B2
(45) Date of Patent: Nov. 5, 2013

(54) SEMICONDUCTOR MEMORY DEVICE WITH FLOATING GATE

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/343,388

(22) Filed: Jan. 4, 2012

(65) Prior Publication Data

US 2012/0181597 A1 Jul. 19, 2012

(30) Foreign Application Priority Data

Jan. 13, 2011 (JP) .................................. 2011-004716

(51) Int. Cl.
*H01L 29/788* (2006.01)

(52) U.S. Cl.
USPC .................................... 257/316; 257/E29.001

(58) Field of Classification Search
USPC .......................................... 257/316, E29.001
See application file for complete search history.

(56) References Cited

U.S. PATENT DOCUMENTS

| | | | | |
|---|---|---|---|---|
| 4,805,138 A | * | 2/1989 | McElroy et al. | 365/185.04 |
| 4,884,239 A | * | 11/1989 | Ono et al. | 365/185.27 |
| 5,200,350 A | * | 4/1993 | Gill et al. | 438/262 |
| 5,424,233 A | * | 6/1995 | Yang et al. | 438/264 |
| 5,535,158 A | * | 7/1996 | Yamagata | 365/185.29 |
| 5,731,856 A | | 3/1998 | Kim et al. | |
| 5,744,864 A | | 4/1998 | Cillessen et al. | |
| 6,294,274 B1 | | 9/2001 | Kawazoe et al. | |
| 6,563,174 B2 | | 5/2003 | Kawasaki et al. | |
| 6,727,522 B1 | | 4/2004 | Kawasaki et al. | |
| 6,815,755 B2 | | 11/2004 | Colclaser et al. | |
| 7,049,190 B2 | | 5/2006 | Takeda et al. | |
| 7,061,014 B2 | | 6/2006 | Hosono et al. | |
| 7,064,346 B2 | | 6/2006 | Kawasaki et al. | |
| 7,105,868 B2 | | 9/2006 | Nause et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Chen, L et al., "Poly-Si Nanowire Nonvolatile Memory with Nanocrystal Indium-Gallium-Zinc-Oxide Charge-Trapping Layer," IEEE Electron Device Letters, vol. 31, No. 12, Dec. 2010, pp. 1407-1409.

(Continued)

*Primary Examiner* — Ida M Soward
(74) *Attorney, Agent, or Firm* — Fish & Richardson P.C.

(57) ABSTRACT

To provide a semiconductor memory device having a floating gate which operates with a short channel. A high-work-function compound semiconductor having a work function of greater than or equal to 5.5 eV, such as indium nitride or zinc nitride, is used for the floating gate. Accordingly, the potential barrier of the floating gate insulating film between the substrate and the floating gate is higher than that of a conventional one, so that leakage of electric charge due to a tunnel effect can be reduced even if the thickness of the floating gate insulating film is made small. Since the thickness of the floating gate insulating film can be made small, the channel can be further shortened.

20 Claims, 5 Drawing Sheets

(56) References Cited

U.S. PATENT DOCUMENTS

| | | | |
|---|---|---|---|
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,482,619 B2 | 1/2009 | Seol et al. | |
| 7,501,293 B2 | 3/2009 | Ito et al. | |
| 7,518,178 B2* | 4/2009 | Takashima et al. | 257/315 |
| 7,550,802 B2 | 6/2009 | Koyanagi et al. | |
| 7,560,767 B2* | 7/2009 | Yasuda et al. | 257/316 |
| 7,659,158 B2* | 2/2010 | Ma et al. | 438/201 |
| 7,667,273 B2* | 2/2010 | Koyama et al. | 257/369 |
| 7,674,650 B2 | 3/2010 | Akimoto et al. | |
| 7,732,819 B2 | 6/2010 | Akimoto et al. | |
| 7,902,588 B2* | 3/2011 | Nishikawa et al. | 257/321 |
| 7,923,364 B2* | 4/2011 | Goda | 438/594 |
| 7,989,289 B2* | 8/2011 | Krishnamohan et al. | 438/260 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0087939 A1* | 4/2008 | Nara | 257/321 |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0121381 A1* | 5/2011 | Kanemura et al. | 257/321 |
| 2012/0097942 A1 | 4/2012 | Imoto et al. | |
| 2012/0112184 A1 | 5/2012 | Yamazaki et al. | |
| 2012/0127796 A1* | 5/2012 | Eitan et al. | 365/185.15 |
| 2012/0146109 A1 | 6/2012 | Yamazaki et al. | |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| WO | 2004/114391 A1 | 12/2004 | |

OTHER PUBLICATIONS

Nakamura, M et al., "The Phase Relations in the In2O3-Ga2ZnO4-ZnO System at 1350° C.," Journal of Solid State Chemistry, vol. 93, 1991, pp. 298-315.

Walukiewicz, W, "Intrinsic Limitations to the Doping of Wide-Gap Semiconductors," Physica B, vol. 302-303, 2001, pp. 123-134.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

(56) References Cited

OTHER PUBLICATIONS

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL, YBFE2O4, and YB2FE3O7 Types of Structures for Compounds in the In2O3 and Sc2O3-A2O3-Bo Systems [A; Fe, Ga, Or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

(56) References Cited

OTHER PUBLICATIONS

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR MEMORY DEVICE WITH FLOATING GATE

BACKGROUND OF THE INVENTION

1. Field of the Invention

The present invention relates to a floating-gate semiconductor memory device.

2. Description of the Related Art

In recent years, semiconductor memory devices such as flash memories which store data by accumulation of electric charge in floating gates (hereinafter, referred to as FG memory devices) have been used for many electronic devices, home appliances, and the like. FG memory devices are highly integrated, and in accordance with that, cost per bit is reduced.

Although silicon has been often used for floating gates conventionally (for example, see Patent Document 1), in recent years, attempts to use materials other than silicon have been reported (for example, see Non-Patent Document 1). In addition, use of semiconductor particles instead of floating gates has been proposed (for example, see Patent Documents 2 and 3).

REFERENCE

Patent Document

[Patent Document 1] U.S. Pat. No. 6,815,755
[Patent Document 2] U.S. Pat. No. 7,550,802
[Patent Document 3] U.S. Pat. No. 7,482,619

Non-Patent Document 1

L. Chen et al., "*Poly-Si Nanowire Nonvolatile Memory With Nanocrystal Indium-Gallium-Zinc-Oxide Charge-Trapping Layer*", IEEE Electron Device Letters, Vol. 31, No. 12, p. 1407 (2010).

SUMMARY OF THE INVENTION

Thus, FG memory devices are amazingly miniaturized and FG memory devices each having a channel length of less than or equal to 30 nm have been put into practical use, while they are about to reach the physical limit, i.e., the physical scaling limit.

An FG memory device is required to hold electric charge in a floating gate for a certain period (for ten years in general). In order to realize that, the thickness of an insulating film surrounding the floating gate (a floating gate insulating film, a control gate insulating film, or the like) cannot be made unlimitedly thin.

For example, it has been pointed out that when silicon is used for a floating gate, silicon oxide is used for a floating gate insulating film, and the thickness of the floating gate insulating film is less than or equal to 6 nm, electric charge in the floating gate leaks due to a tunnel effect, and thus, electric charge cannot be held for ten years (see Patent Document 1).

On the other hand, when the thickness of the floating gate insulating film is greater than 6 nm, it is difficult to set the channel length to less than or equal to 20 nm. Even if the channel length is set to less than or equal to 20 nm, due to a short channel effect, the on/off ratio of a transistor cannot be sufficiently high, which leads to difficulty in matrix driving.

In view of such a present situation, it is an object of the present invention to provide an FG memory device in which the thickness of a floating gate insulating film is made thinner. It is another object of the present invention to provide a novel semiconductor device (specifically a novel transistor). It is another object of the present invention to provide a novel method for driving a semiconductor device (specifically a novel method for driving a transistor). Further, it is another object of the present invention to provide a novel method for manufacturing a semiconductor device (specifically a novel method for manufacturing a transistor).

Moreover, it is another object of the present invention to provide a semiconductor device (specifically a transistor) which has improved performance or consumes less electric power. It is another object of the present invention to provide a method for driving a semiconductor device (specifically a method for driving a transistor) which has improved performance or consumes less electric power. It is another object of the present invention to provide a method for manufacturing a semiconductor device which has improved performance or consumes less electric power (specifically a method for manufacturing a transistor). In the present invention, at least one of the above-described objects is achieved.

An embodiment of the present invention is an FG memory device using a high-work-function n-type semiconductor having a work function of greater than or equal to 5.5 eV which contains nitrogen and at least one of indium and zinc (hereinafter, also referred to as a high-work-function compound semiconductor) as a material for a floating gate.

In the FG memory device, the carrier concentration in the material of the floating gate is preferably greater than or equal to $1\times10^{19}/\text{cm}^{-3}$. Further, in the FG memory device, the thickness of a floating gate insulating film is preferably greater than or equal to 2 nm and less than or equal to 4 nm.

Here, the high-work-function compound semiconductor contains nitrogen at a concentration of greater than or equal to 5 at. % and less than or equal to 50 at. %. Further, the high-work-function compound semiconductor desirably contains zinc at a concentration of greater than or equal to 5 at. % and less than or equal to 66.7 at. %, or indium at a concentration of greater than or equal to 5 at. % and less than or equal to 50 at. %.

The high-work-function compound semiconductor may contain a metal element with an atomic number of 20 or less at a concentration of less than or equal to 1%, preferably less than or equal to 0.01%. The high-work-function compound semiconductor may contain oxygen or another metal element with an atomic number of 21 or more. The high-work-function compound semiconductor may contain hydrogen at a concentration of 0.01 at. % to 10 at. %.

The high-work-function compound semiconductor is preferably a single crystal or polycrystal body having a wurtzite-type crystal structure. The high-work-function compound semiconductor may have a hexagonal crystal structure other than the wurtzite type.

The electron affinity of the above-described high-work-function compound semiconductor is greater than or equal to 5.5 eV. Therefore, many of defect levels formed at levels which are 4 eV to 5 eV below the vacuum level (typically, the level which is 4.9 eV below the vacuum level) serve as donors, and an n-type semiconductor having an electron concentration of greater than or equal to $1\times10^{19}$ cm$^{-3}$, preferably greater than or equal to $1\times10^{20}$ cm$^{-3}$ is provided without particular doping treatment (for details, see W. Walukiewicz, "Intrinsic limitations to the doping of wide-gap semiconductors", Physica B 302-303, pp. 123-134, 2001).

Indium nitride with a chemical formula of InN is given as an example of the above-described high-work-function compound semiconductor. Indium nitride is a semiconductor with a band gap of less than or equal to 0.7 eV and an electron affinity of 5.6 eV. Indium nitride is known to have a wurtzite type structure.

Zinc nitride known to have a chemical formula of $Zn_3N_2$ is given as another example. The details of the physical values of zinc nitride have not been known; however, the electron affinity thereof is approximately 5.5 eV. It is known that zinc nitride has a cubic crystal structure.

Such a high-work-function compound semiconductor may be manufactured by any known method, such as a sputtering method, a vacuum evaporation method, an ion plating method, an MBE (molecular beam epitaxy) method, a CVD method (an MOCVD (metal organic CVD) method or an ALD (atomic layer deposition) method), or the like.

For example, when gallium indium nitride ($In_{1-a}Ga_aN$) is manufactured by an MOCVD method, trimethylindium (($CH_3$)$_3$In), trimethylgallium (($CH_3$)$_3$Ga), and ammonia may be used as a source gas and the substrate temperature may be set to 350° C. to 550° C.

As described above, the work function of a high-work-function compound semiconductor is greater than or equal to 5.5 eV. Therefore, in the case where silicon oxide is bonded to the high-work-function compound semiconductor, a difference between the bottom of the conduction band of silicon oxide and the Fermi level of the high-work-function compound semiconductor is 4.6 eV. Since the difference is larger than a difference between the bottom of the conduction band of silicon oxide and the Fermi level of an n-type silicon, which is 3.2 eV, or a difference between the bottom of the conduction band of silicon oxide and the Fermi level of a p-type silicon, which is 4.3 eV, in the case where the high-work-function compound semiconductor is used as a material of the floating gate, the floating gate insulating film serves as a higher potential barrier.

Accordingly, even if the thickness of the floating gate insulating film is made thinner than ever, leakage of electric charge from the floating gate due to a tunnel effect can be prevented. By making the thickness of the floating gate insulating film smaller, the channel length can be made small. For example, when the thickness of the floating gate insulating film is 2 nm, an FG memory device having a channel length of 7 nm can be manufactured.

Although an example in which silicon oxide is used for the floating gate insulating film is described above, the same applies to other insulating materials.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

[Embodiment 1]

Figure 1A:
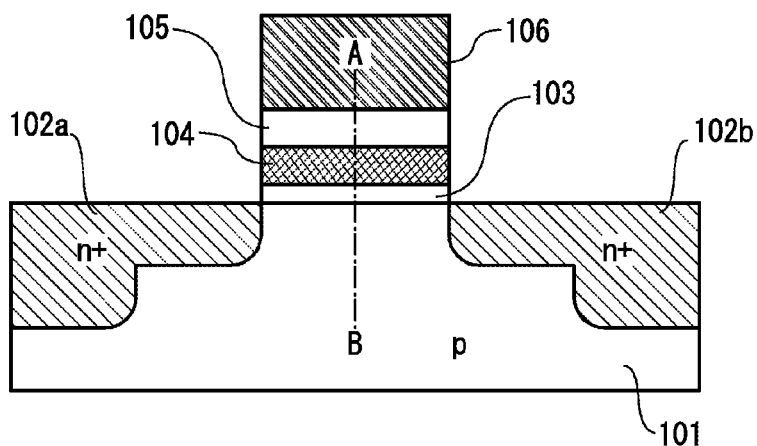
FIGS. 1A to 1C are views each illustrating an example of a semiconductor memory device of the present invention.

FIG. 1A illustrates an example of an FG memory device in this embodiment. Here, a schematic cross-sectional view of a transistor in a channel direction is illustrated. The transistor includes a floating gate 104 including a high-work-function compound semiconductor having a thickness of greater than or equal to 5 nm and less than or equal to 100 nm over a substrate 101 of p-type single crystal silicon, and includes a floating gate insulating film 103 with an appropriate thickness between the floating gate 104 and the substrate 101.

Note that for the substrate 101, a semiconductor material such as germanium, gallium arsenide, or gallium antimonide which has an electron affinity of 3.5 eV to 4.5 eV and a band gap of less than or equal to 1.5 eV can be used other than silicon.

The width of the floating gate 104, which is important in determining the channel length of the transistor, is set to less than or equal to 50 nm, preferably less than or equal to 20 nm. Further, the thickness of the floating gate insulating film 103 may be set to 2 nm to 4 nm.

The substrate 101 is provided with a source 102a and a drain 102b. As illustrated in FIG. 1A, the source 102a and the drain 102b may be formed in a manner similar to that of a so-called extension region used in a known VLSI technology, which is effective in preventing a short channel effect. Note that in order to prevent a short channel effect, the impurity concentration of the substrate 101 is preferably set to an appropriate value.

A control gate 106 is provided over the floating gate 104 with a control gate insulating film 105 having an appropriate thickness interposed therebetween. The thickness of the control gate insulating film 105 can be set to 2 nm to 20 nm. The control gate insulating film 105 preferably has a larger thickness than the floating gate insulating film 103.

Figure 1B:
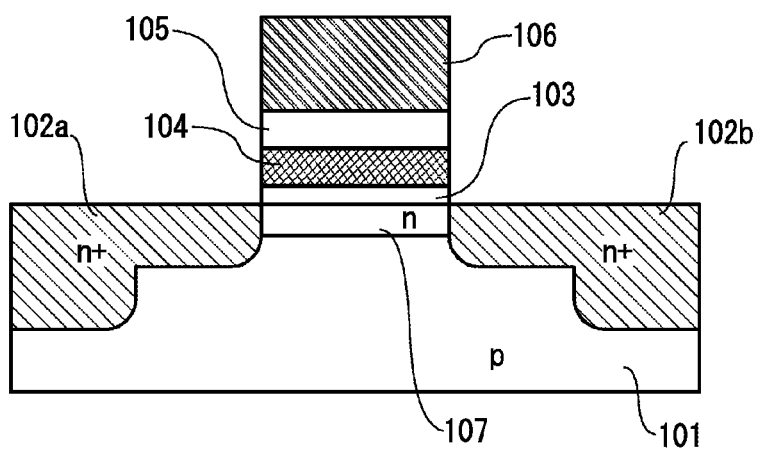

Note that since a high-work-function compound semiconductor has a work function of 5.5 eV which is higher than the work function of p-type silicon (5.15 eV), an electron state of a channel region is largely affected. Specifically, the high-work-function compound semiconductor induces many holes to a surface of the channel. As a result, when the transistor is an n-channel transistor and the surface of the channel is a p-channel, the threshold voltage becomes too high and switching cannot be performed appropriately in some cases. Therefore, as illustrated in FIG. 1B, an n-type region 107 may be formed under the floating gate 104.

Figure 1C:
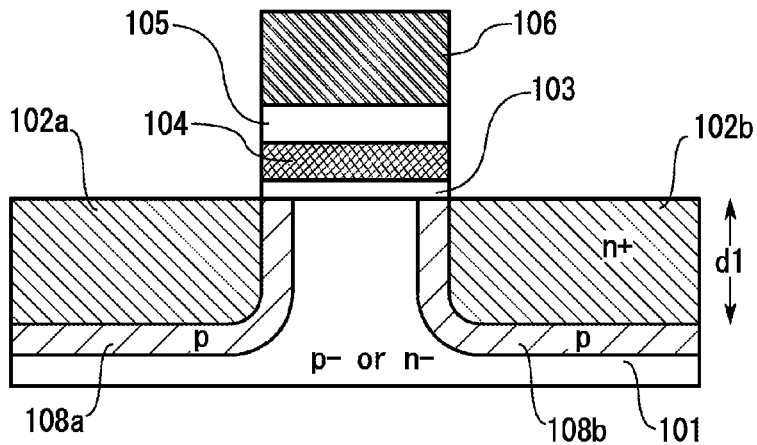

Further, in order to prevent a short channel effect, as illustrated in FIG. 1C, a halo region 108a and a halo region 108b (regions having higher concentration of p-type impurities than the substrate 101) may be provided in the periphery of the source 102a and the drain 102b, respectively. In the case of forming the halo regions 108a and 108b, the depths of the source 102a and the drain 102b of a vicinity of the channel may be relatively large. For example, a depth d1 shown in FIG. 1C may be less than or equal to 2 times as large as the channel length.

Figure 5A:
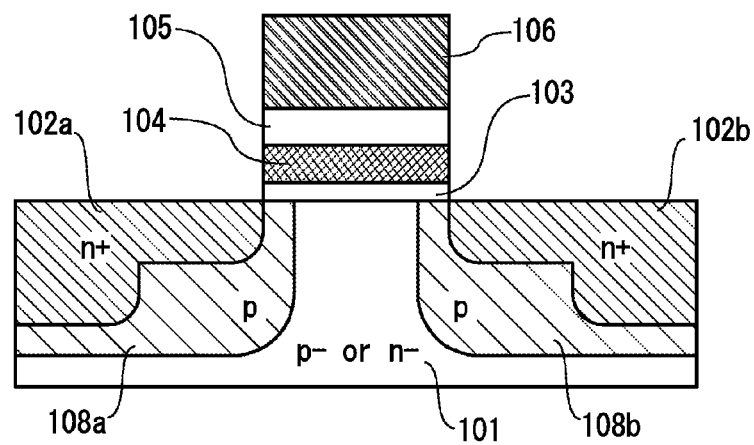
FIGS. 5A to 5C are views each illustrating an example of a semiconductor memory device of the present invention.

Needless to say, also in the transistor having the structure illustrated in FIG. 1A, the halo regions 108a and 108b may be formed (see FIG. 5A). Note that in the case where the source 102a and the drain 102b are surrounded by the halo region 108a and the halo region 108b, respectively, in this manner, the impurity concentration in the substrate 101 may be extremely low, and the conductivity type may be either n-type or p-type.

The substrate 101 includes a region where the channel is formed. The impurity concentration in the region is made low, whereby variation in threshold voltage of a short-channel transistor can be reduced. For example, in order to sufficiently reduce variation in threshold voltage of a transistor having a channel length of less than or equal to 20 nm, the impurity concentration in the region where the channel is formed may be less than or equal to $1\times10^{15}$ cm$^{-3}$, preferably less than or equal to $1\times10^{13}$ cm$^{-3}$.

Note that in the case where a high-work-function compound semiconductor is used for the floating gate, the hole concentration in the vicinity of the channel becomes extremely high due to the high work function, and thus entry of electrons from the source 102a and the drain 102b can be prevented even if doping with p-type impurities is not performed.

Focusing on the effect, the region where the channel is formed does not need to be doped with p-type impurities. For example, as illustrated in FIG. 5B, the halo regions (or impurity regions corresponding to the halo regions) 108a and 108b may be provided only under the source 102a and the drain 102b, respectively.

Since it is unnecessary to introduce p-type impurities at a high concentration into the region where the channel is formed in this case, variation in threshold voltage of the transistor can be further reduced. Note that in order to prevent a short channel effect, a depth d3 of the source 102a and the drain 102b is less than or equal to 0.75 times as large as the channel length, preferably less than or equal to 0.5 times as large as the channel length. When the technical idea illustrated in FIG. 5B is applied to the transistor of FIG. 1A, a transistor having the halo regions 108a and 108b, as illustrated in FIG. 5C, can be obtained.

Figure 5B:
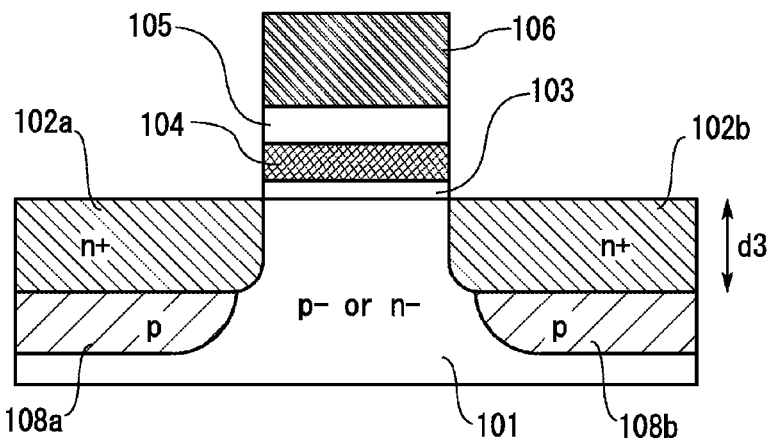
Figure 5C:
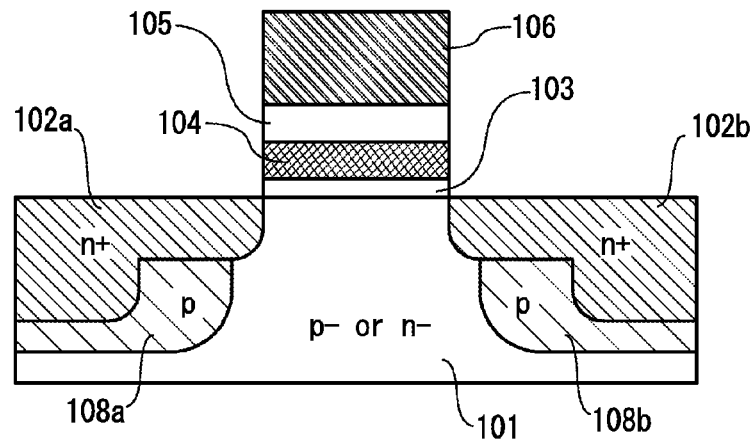

In particular, as illustrated in FIGS. 5B and 5C, the halo regions 108a and 108b are formed outside the channel region, which is preferable in order to increase reliability of the transistor because when the halo regions 108a and 108b are formed by an ion implantation method, ions do not pass through the floating gate insulating film 103 provided over the channel region, so that a trap level or the like is not formed in the floating gate insulating film 103.

Figure 4A:
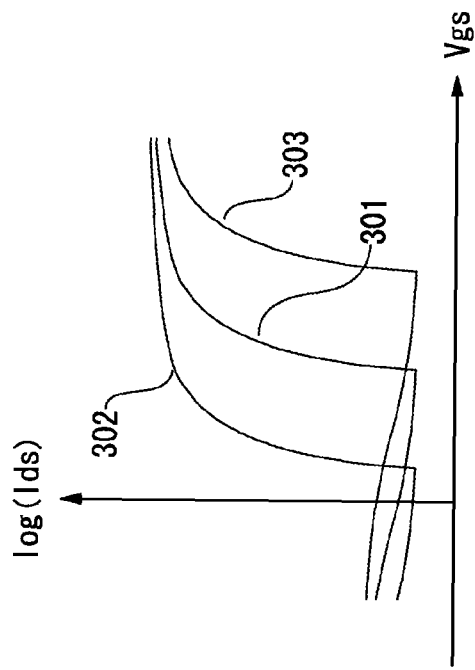
FIG. 4A shows an example of a band condition of a semiconductor memory device of the present invention and FIG. 4B shows an example of electric characteristics thereof.

FIG. 4A shows an example of energy band condition along line AB in a center portion of the transistor illustrated in FIG. 1A. Note that here, the potentials of the control gate 106, the source 102a, and the drain 102b are equal to one another and there is no electric charge in the floating gate. Moreover, Ef represents the Fermi level, Ec represents the bottom of a conduction band, and Ev represents the top of a valence band. For the control gate, a metal having a work function of 4.9 eV is assumed. The same can be said for an n-type silicon which is generally used.

FIG. 4A shows an energy band of a portion from the control gate 106 to the substrate 101 via the floating gate 104. Although the impurity concentration in the substrate 101 is extremely low, the hole concentration in the vicinity of the surface becomes high due to an influence of the floating gate 104 formed using the high-work-function compound semiconductor (in FIG. 4A, the work function is 5.5 eV).

Note that as described above, since a high-work-function compound semiconductor is an n-type, the Fermi level thereof is substantially equal to or higher than the bottom of the conduction band. FIG. 4A shows the state where the high-work-function compound semiconductor is degenerated and the carrier concentration is approximately $1\times10^{21}$ cm$^{-3}$.

An energy difference E1 in FIG. 4A can be obtained by (the work function of the floating gate 104)−(the electron affinity of the floating gate insulating film 103). An energy difference E2 in FIG. 4A can be obtained by (the electron affinity of the substrate 101)−(the electron affinity of the floating gate insulating film 103). When the floating gate insulating film 103 is formed using silicon oxide (having an electron affinity of 0.9 eV), E1 is 4.6 eV and E2 is 4.0 eV.

Further, E4 is an energy difference between the bottom of the conduction band Ec and the Fermi level Ef of a portion of the substrate 101 which is in contact with the floating gate insulating film 103, and since the high-work-function compound semiconductor is used for the floating gate 104 as described above, the energy difference E4 is generally greater than or equal to 0.8 eV.

Moreover, E3 can be obtained by E1−E2−E4. In the case where E4 is 1.1 eV, E3 is 1.2 eV. Here, in the case where electrons existing in the conduction band transfer to the floating gate 104 for some reason, it is necessary for electrons to go over a potential barrier of E2+E3=4.4 eV.

On the other hand, in the case where silicon is used for the floating gate as in a known FG memory device, the potential barrier is only 3.2 eV. Thus, when a high-work-function compound semiconductor is used for the floating gate 104, the potential barrier is higher than that of a known FG memory device in which silicon is used for the floating gate by greater than or equal to 1 eV; therefore, probability of electron transfer (tunnel probability) is extremely low. Accordingly, when a high-work-function compound semiconductor is used for the floating gate, the thickness of the floating gate insulating film 103 can be made smaller.

Figure 4B:
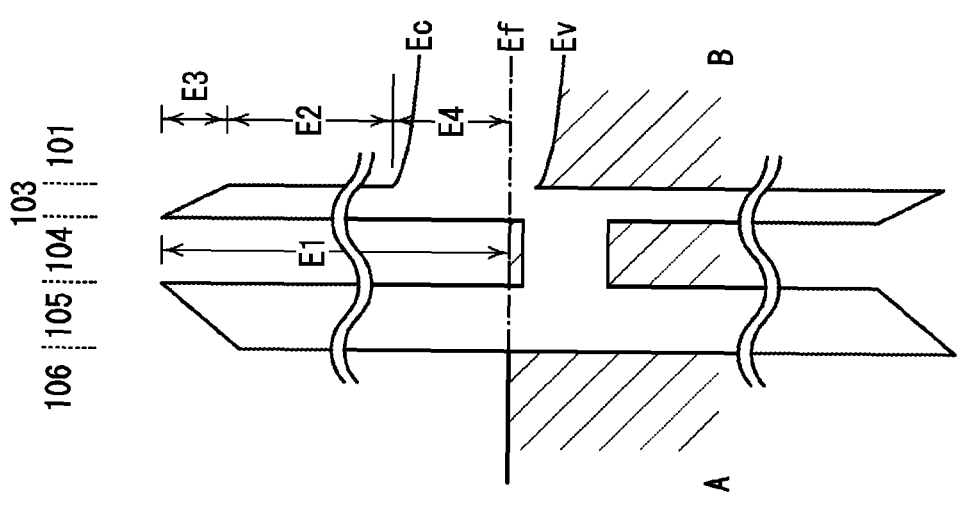

The transistor of FIG. 1A has gate voltage (Vg)-drain current (Id) characteristics shown by a curve 301 in FIG. 4B when the floating gate 104 is not charged. When the floating gate 104 is positively charged, as shown by a curve 302, the characteristics shift to a negative side. When the floating gate 104 is negatively charged, as shown by a curve 303, the characteristics move to a positive side. Note that FIG. 4B is one explanation for easy understanding of change in characteristics.

When a high-work-function compound semiconductor is used for the floating gate 104, the threshold voltage is higher than that of a known FG memory device by greater than or equal to 1 volt. The threshold voltage of the FG memory device where a high-work-function compound semiconductor is used for the floating gate 104 is higher than or equal to 1.6 volts although it also depends on the impurity concentration in the substrate 101 (or the region where the channel is formed). Although such a transistor having high threshold voltage is difficult to use as a normal MOS transistor, a problem does not occur in some cases as long as it is used in an FG memory device.

For example, on the assumption that data "1" means that the floating gate 104 is positively charged (the threshold voltage is approximately 0.6 volts) and data "0" means that the floating gate 104 is not charged (the threshold voltage is approximately 1.6 volts), when the voltage of the control gate 106 is 1 V, the transistor is ON in the case of the data "1", and the transistor is OFF in the case of the data "0". Further, when the voltage of the control gate 106 is 0 V, the transistor is OFF regardless whether the data is "1" or "0". In other words, such a transistor is suitable for a NOR-type memory circuit.

[Embodiment 2]

Figure 2A:
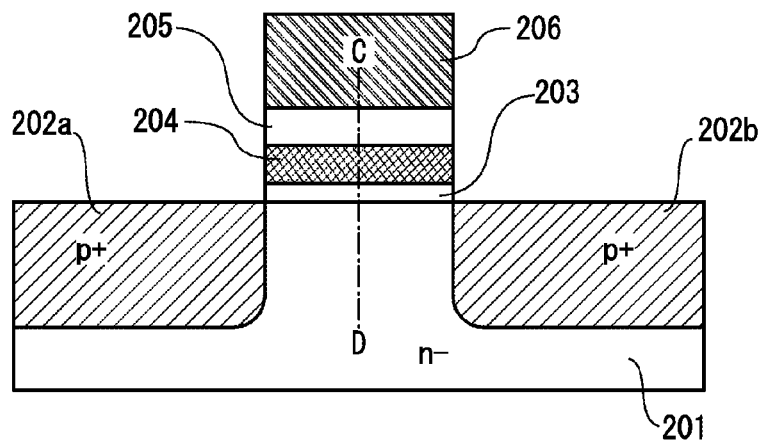
FIGS. 2A to 2C are views each illustrating an example of a semiconductor memory device of the present invention.

FIG. 2A illustrates an example of an FG memory device of this embodiment. Note that Embodiment 1 can be referred to for part of descriptions. Here, a schematic cross-sectional view of a transistor in a channel direction is illustrated. The transistor includes a floating gate 204 formed using a high-work-function compound semiconductor having a thickness of greater than or equal to 5 nm and less than or equal to 100 nm over an n-type single crystal silicon substrate 201, and includes a floating gate insulating film 203 having an appropriate thickness between the floating gate 204 and the substrate 201.

The width of the floating gate 204 is less than or equal to 50 nm, preferably less than or equal to 20 nm, more preferably less than or equal to 10 nm. Further, the thickness of the floating gate insulating film 203 is preferably set to 2 nm to 4 nm.

The substrate 201 is doped with p-type impurities to form a source 202a and a drain 202b. A control gate 206 is provided over the floating gate 204 with a control gate insulating film 205 having an appropriate thickness interposed therebetween. The thickness of the control gate insulating film 205 can be set to 2 nm to 20 nm.

Since a high-work-function compound semiconductor is used for the floating gate 204, the hole concentration in a portion of the substrate 201 under the floating gate 204 is high. When the floating gate 204 is positively charged, the hole concentration in the portion of the substrate 201 under the floating gate 204 decreases.

Figure 2B:
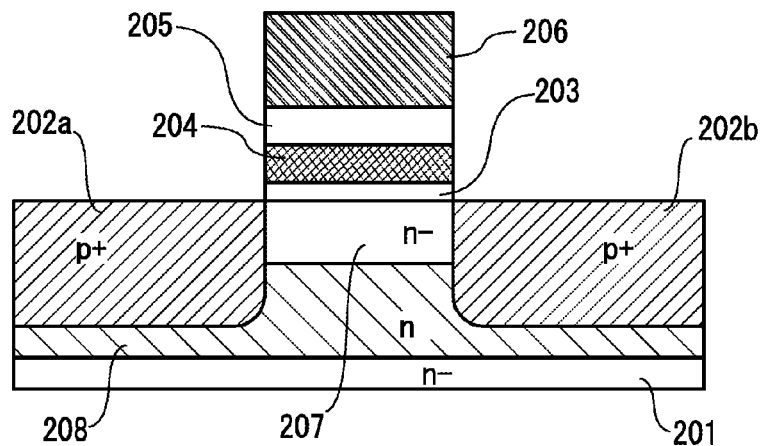

In order to prevent a punch-through current between the source 202a and the drain 202b, as illustrated in FIG. 2B, a portion of the region in contact with bottom surfaces and side surfaces of the source 202a and the drain 202b may be doped with n-type impurities to form an n-type region 208. Note that when such a method is employed, the impurity concentration in the substrate 201 (and a weak n-type region 207 divided from the substrate 201 by the n-type region 208) can be made as low as possible, which is preferable in order to reduce variation in threshold voltage.

Figure 2C:
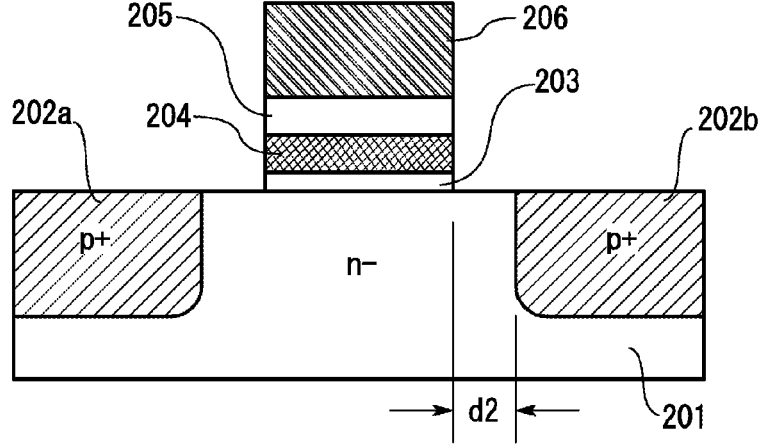

Further, as illustrated in FIG. 2C, offset regions each having a width d2 may be formed between the floating gate 204 and the source 202a and between the floating gate 204 and the drain 202b.

[Embodiment 3]

Figure 3A:
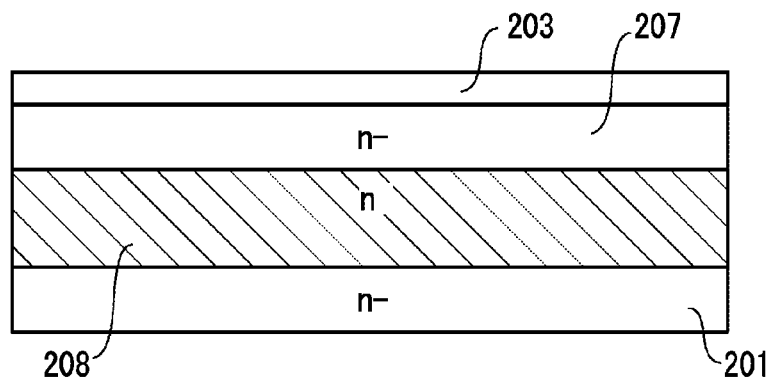
FIGS. 3A to 3C are views illustrating an example of a method for manufacturing a semiconductor memory device of the present invention.
Figure 3B:
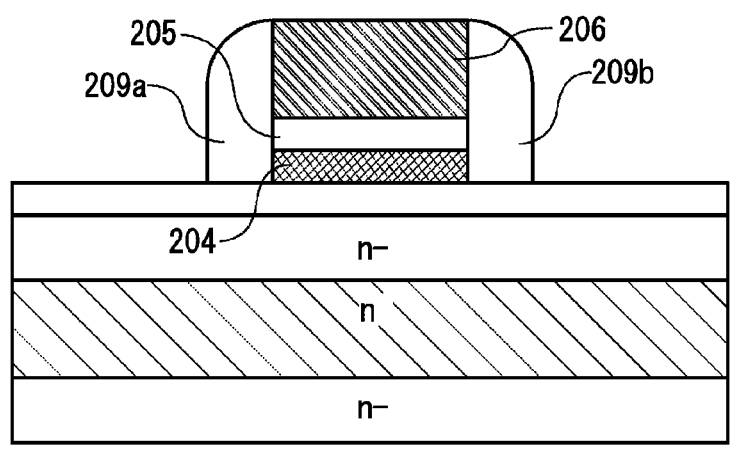
Figure 3C:
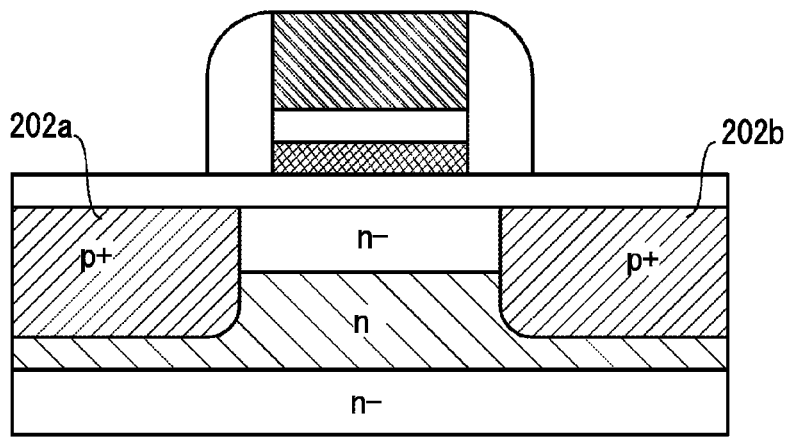

An example of a method for manufacturing an FG memory device having both characteristics of the FG memory devices illustrated in FIGS. 2B and 2C will be described with reference to FIGS. 3A to 3C. Many steps can be performed in accordance with known semiconductor techniques; therefore, as for the details, the known techniques can be used as a reference.

First, a portion of the n-type high-resistance single crystal silicon substrate 201 (the impurity concentration is $1\times10^{13}$ $cm^{-3}$ to $1\times10^{17}$ $cm^{-3}$) to the depth of 10 nm to 200 nm is doped with n-type impurities to form the n-type region 208. As an n-type impurity element, an element which can control the depth precisely, such as arsenic, is used, and the impurity concentration may be $1\times10^{18}$ $cm^{-3}$ to $1\times10^{20}$ $cm^{-3}$. As a result, the weak n-type region 207 (having the same impurity concentration as the substrate 201) is formed in a shallow portion in the vicinity of the surface of the substrate.

Alternatively, the weak n-type region 207 may be formed by epitaxial growth on a surface of the n-type region 208. In that case, the thickness of the weak n-type region 207 may be 5 nm to 50 nm (preferably 5 nm to 20 nm), and the impurity concentration may be $1\times10^{11}$ $cm^{-3}$ to $1\times10^{17}$ $cm^{-3}$. Further, the impurity concentration in the weak n-type region 207 may be different from that in the substrate 201.

The floating gate insulating film 203 is formed over the weak n-type region 207. As the floating gate insulating film 203, for example, a silicon oxynitride film having a thickness of 2 nm to 4 nm which is obtained by thermal oxidation may be used (see FIG. 3A).

After that, an oxynitride film with high work function (hereinafter referred to as a high-work-function oxynitride film) such as zinc oxynitride, indium oxynitride, indium-zinc oxynitride, or indium-zinc-gallium oxynitride (composition formula: $In_aGa_bZn_cO_dN_e$ ($0 \leq a \leq 1$, $0 \leq b \leq 1$, $0 \leq c \leq 1$, $0 \leq d \leq 1$, $0 \leq e \leq 1$)) is formed by a reactive sputtering method.

For example, in order to form zinc oxynitride, a condition in which zinc oxide is a target and the nitrogen concentration is greater than or equal to 50% and the oxygen concentration is less than or equal to 5% in an atmosphere may be employed. In a similar manner, in order to form indium oxynitride, indium-zinc oxynitride, or indium-zinc-gallium oxynitride, the nitrogen concentration may be greater than or equal to 50% and the oxygen concentration may be less than or equal to 5% in the atmosphere, and indium oxide, indium-zinc oxide, or indium-zinc-gallium oxide may be used as the target, respectively.

In that case, the substrate temperature may be set in the range from 100° C. to 600° C., preferably 150° C. to 450° C. After the film formation, thermal treatment may be performed under a non-oxidization atmosphere at 100° C. to 600° C., preferably 150° C. to 450° C.

Note that an ALD method or a CVD method (such as an MOCVD method) may be employed other than a sputtering method. In particular, the use of an ALD method or a CVD method which gives less damage on the substrate is preferable.

The high-work-function oxynitride film may have a thickness of 5 nm to 100 nm. When the thickness is less than 5 nm, the work function does not affect a surface of the substrate 201; when the thickness is more than 100 nm, the resistance of the high-work-function oxynitride film becomes high, which is not preferable for the characteristics of circuits. As described above, the defect levels in the vicinity of the interface serve as donors in the high-work-function oxynitride film; therefore, in a portion which is far from the interface, the donor concentration decreases and the conductivity deteriorates in some cases. In order to keep the conductivity, additional doping with donors may be performed.

It is known that an example of indium-zinc-gallium oxide represented by the composition formula $InGaZnO_4$ has a crystal structure called a $YbFe_2O_4$ structure (for example, see M. Nakamura, N. Kimizuka, and T. Mohri, "*The Phase Relations in the $In_2O_3$—$Ga_2ZnO_4$—$ZnO$ System at 1350° C.*", J. Solid State Chem., Vol. 93, pp. 298-315 (1991)).

However, for example, when 5 at. % or more of nitrogen is added, the wurtzite type structure becomes a stable phase; accordingly, the electron state drastically changes. Since the wurtzite type structure is crystallized more easily than the $YbFe_2O_4$ structure, the crystallization is performed at relatively low temperature.

As for the electron state, for example, the $YbFe_2O_4$ structure has a band gap of approximately 3.2 eV, while the wurtzite type structure has a band gap of less than or equal to 2.2 eV. The electron affinity of the former is approximately 4.3 eV, while that of the latter is greater than or equal to 5.5 eV. Since the electron affinity is greater than 4.9 eV, the n-type conductivity is exhibited due to the defect level. Since hydrogen functions as a donor, the carrier concentration can be increased also by adding hydrogen.

It is preferable that besides nitrogen, zinc, and indium, the high-work-function oxynitride film contain oxygen 2 to 5 times as much as nitrogen because the generation of trap levels at the interface with silicon oxide can be suppressed. Moreover, it is preferable that the high-work-function oxynitride film contain 1 at. % to 10 at. % of hydrogen because the state of the interface can be improved and the carriers are increased to improve the conductivity. Other than in the film formation step, the addition of hydrogen to the high-work-function oxynitride film can be performed in hydrogenation treatment after the completion of a doping step.

Note that instead of indium-zinc-gallium oxide (In—Ga—Zn—O), a binary metal oxide such as In—Sn—O, Sn—Zn—O, Al—Zn—O, or In—Ga—O; a tertiary metal oxide such as In—Sn—Zn—O, In—Al—Zn—O, Sn—Ga—Zn—O, Al—Ga—Zn—O, Sn—Al—Zn—O; a quaternary metal oxide such as In—Sn—Ga—Zn—O; or the like may be used as the target. Here, for example, In—Ga—Zn—O means an oxide containing indium (In), gallium (Ga), and zinc (Zn).

After that, the high-work-function oxynitride film is etched to form the floating gate 204. Further, an insulating film and a metal film (or a metal compound film) having high conductivity are formed over the floating gate 204 to an appropriate thickness. For the insulating film, other than silicon oxide or silicon oxynitride, a high-dielectric-constant material such as hafnium oxide, aluminum oxide, or lanthanum oxide can be used. For example, a stacked-layer structure of silicon oxide and a high-dielectric-constant material may be employed.

For the metal film, aluminum, titanium, tantalum, tungsten, or the like or an alloy containing any of these by greater than or equal to 50% can be used. For the metal compound film, a nitride film containing any of these can be used.

After that, the insulating film and the metal film (or the metal compound film) are processed into necessary shapes to form the control gate insulating film 205 and the control gate 206, respectively. Next, a sidewall 209a and a sidewall 209b are formed on side surfaces of the control gate 206 (see FIG. 3B).

Further, boron ions are implanted by an ion implantation method, whereby the source 202a and the drain 202b are formed. At this time, bottom surfaces of the source 202a and the drain 202b are preferably shallower than a bottom surface of the n-type region 208 (see FIG. 3C). Ion species used for ion implantation may be a compound including boron such as a borane.

Through the above steps, a main structure of the transistor is formed. After that, a siliciding process, formation of multilayer wirings and electrodes, hydrogenation treatment, and the like may be performed in accordance with known semiconductor fabrication techniques. In this embodiment, an example in which single crystal silicon is used for the substrate 201 is described; however, a so-called SOI (silicon on insulator) substrate in which a single crystal silicon layer is formed on an insulating film may be used as a substrate.

This application is based on Japanese Patent Application serial no. 2011-004716 filed with the Japan Patent Office on Jan. 13, 2011, the entire contents of which are hereby incorporated by reference.

What is claimed is:

1. A semiconductor memory device comprising;
a floating gate insulating film;
a floating gate over the floating gate insulating film;
a control gate insulating film over the floating gate; and
a control gate over the control gate insulating film
wherein the floating gate comprises an n-type semiconductor having a work function of greater than or equal to 5.5 eV, and
wherein the floating gate contains nitrogen and one selected from the group consisting of indium and zinc.

2. The semiconductor memory device according to claim 1, wherein a carrier concentration in the floating gate is greater than or equal to $1 \times 10^{19}$ cm$^{-3}$.

3. The semiconductor memory device according to claim 1, wherein a thickness of the floating gate insulating film is greater than or equal to 2 nm and less than or equal to 4 nm.

4. The semiconductor memory device according to claim 1, wherein the floating gate contains hydrogen at a concentration of 0.01 atomic % to 10 atomic %.

5. The semiconductor memory device according to claim 1, wherein the floating gate contains oxygen.

6. The semiconductor memory device according to claim 1, wherein the floating gate comprises indium nitride.

7. A semiconductor memory device comprising;
a floating gate insulating film;
a floating gate over the floating gate insulating film;
a control gate insulating film over the floating gate; and
a control gate over the control gate insulating film
wherein the floating gate contains nitrogen at a concentration of greater than or equal to 5 atomic % and less than or equal to 50 atomic %, and one selected from the group consisting of zinc and indium.

8. The semiconductor memory device according to claim 7, wherein a carrier concentration in the floating gate is greater than or equal to $1 \times 10^{19}$ cm$^{-3}$.

9. The semiconductor memory device according to claim 7, wherein a thickness of the floating gate insulating film is greater than or equal to 2 nm and less than or equal to 4 nm.

10. The semiconductor memory device according to claim 7, wherein the floating gate contains hydrogen at a concentration of 0.01 atomic % to 10 atomic %.

11. The semiconductor memory device according to claim 7, wherein the floating gate contains oxygen.

12. The semiconductor memory device according to claim 7, wherein a concentration of zinc is greater than or equal to 5 atomic % and less than or equal to 66.7 atomic %.

13. The semiconductor memory device according to claim 7, wherein a concentration of indium is greater than or equal to 5 atomic % and less than or equal to 50 atomic %.

14. A semiconductor memory device comprising;
a semiconductor including a source and a drain:
a floating gate insulating film over the semiconductor; and
a floating gate over the floating gate insulating film,
wherein the semiconductor is a material whose electron affinity is 3.5 eV to 4.5 eV and whose band gap is equal to or less than 1.5 eV, and
wherein the floating gate comprises an n-type semiconductor having a work function of greater than or equal to 5.5 eV.

15. The semiconductor memory device according to claim 14, wherein a carrier concentration in the floating gate is greater than or equal to $1 \times 10^{19}$ cm$^{-3}$.

16. The semiconductor memory device according to claim 14, wherein a thickness of the floating gate insulating film is greater than or equal to 2 nm and less than or equal to 4 nm.

17. The semiconductor memory device according to claim 14, wherein the floating gate contains hydrogen at a concentration of 0.01 atomic % to 10 atomic %.

18. The semiconductor memory device according to claim 14, wherein the floating gate contains oxygen.

19. The semiconductor memory device according to claim 14, wherein a impurity concentration of the semiconductor is less than or equal to $1\times10^{15}$ cm$^{-3}$.

20. The semiconductor memory device according to claim 14, wherein halo regions are provided in contact with the source and the drain.

* * * * *